United States Patent
Lee

(10) Patent No.: US 7,476,944 B2
(45) Date of Patent: Jan. 13, 2009

(54) STATIC RANDOM ACCESS MEMORIES INCLUDING A SILICON-ON-INSULATOR SUBSTRATE

(75) Inventor: Jong-wook Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 10/893,815

(22) Filed: Jul. 19, 2004

(65) Prior Publication Data
US 2005/0073061 A1 Apr. 7, 2005

(30) Foreign Application Priority Data
Oct. 4, 2003 (KR) .................. 10-2003-0068995

(51) Int. Cl.
*H01L 27/088* (2006.01)
(52) U.S. Cl. .............. 257/393; 257/903; 257/E27.098; 257/E21.661
(58) Field of Classification Search .......... 257/E27.098, 257/E21.661, 202–208, 903, 393
See application file for complete search history.

(56) References Cited

U.S. PATENT DOCUMENTS 6,432,799 B1* 8/2002 Hashimoto et al. .......... 438/435
6,876,040 B1* 4/2005 Wann et al. .................. 257/351
2004/0155281 A1* 8/2004 Osada et al. ................. 257/315
2006/0231899 A1* 10/2006 Chang et al. ................. 257/368

FOREIGN PATENT DOCUMENTS

JP 07-326659 12/1995
JP 09-022951 1/1997

OTHER PUBLICATIONS

Notice to Submit a Response for Korean patent application No. 10-2003-0068995 on May 30, 2005.

* cited by examiner

*Primary Examiner*—Lynne A. Gurley
*Assistant Examiner*—Colleen Matthews
(74) *Attorney, Agent, or Firm*—Myers Bigel Sibley & Sajovec

(57) ABSTRACT

Static random access memories (SRAMs) include a semiconductor substrate having a buried insulator in a predetermined portion of the semiconductor substrate and a silicon-on-insulator (SOI) region including a semiconductor layer on the buried insulator. A flip-flop circuit is in the SOI region and a pass transistor connected to the flip-flop circuit is on a bulk region of the semiconductor substrate. The bulk region of the semiconductor substrate is a separate region from the SOI region. The flip-flop circuit may include at least two CMOS inverters and the pass transistor may be a plurality of pass transistors.

32 Claims, 5 Drawing Sheets

STATIC RANDOM ACCESS MEMORIES INCLUDING A SILICON-ON-INSULATOR SUBSTRATE

CROSS REFERENCE TO RELATED APPLICATIONS

This application claims the priority of Korean Patent Application No. 2003-68995, filed on Oct. 4, 2003, in the Korean Intellectual Property Office, the disclosure of which is incorporated herein in its entirety by reference.

BACKGROUND OF THE INVENTION

The present invention relates to integrated circuit devices, and more particularly, to integrated circuit memory devices.

Static random access memories (SRAMs) are typically high speed memory devices, with relatively low power consumption, which generally do not need to refresh data. SRAMs may be effectively employed in mobile equipment, such as cellular phones. Generally, SRAM memory cells include two inverters that form a flip-flop circuit to which two pass transistors are coupled. Conventional SRAM cells may be classified into load SRAM and CMOS SRAM. In load SRAM, pull down transistors and a load coupled to the pull down transistors are generally included in inverters, which, in turn, form a flip-flop circuit. A resistor or a thin film transistor may be used as the load. In CMOS SRAM, pull up transistors and pull down transistors, that is, CMOS transistors including PMOS and NMOS transistors, are generally included in inverters, which, in turn, form a flip-flop circuit. The CMOS structure, in which SRAM cells are configured using a CMOS process, may be useful because CMOS SRAM devices generally have superior electrical characteristics in comparison to load SRAM.

Problems may arise when configuring SRAM cells using a CMOS process. For example, it may be difficult to scale down the size of SRAM cells. When configuring SRAM cells in a CMOS process, six transistors may be integrated into a single SRAM cell, and NMOS and PMOS transistors coexist in the single SRAM cell. Therefore, a relatively large space may be required for the SRAM cell.

In addition, a complicated well structure may be needed for separating the NMOS transistors from the PMOS transistors, which may increase the size of the SRAM cell. For example, an N-well for a PMOS transistor would typically be formed within a P-well for an NMOS transistor. The N-well may be formed in a bulk substrate and surround at least the PMOS transistor, which may create a large gap between the NMOS and PMOS transistors. In this regard, there have been numerous studies and attempts to come up with ways to limit an increase in the overall size of SRAM cells caused by such a complicated well structure when configuring SRAM cells for a CMOS process.

Another possible problem is latch-up, which is a problem related to the coexistence of NMOS and PMOS transistors in an SRAM cell configured in a CMOS process. Furthermore, as a gate is scaled down, a soft error rate (SER), which indicates reliability, an important characteristic of SRAMs, may increase.

SUMMARY OF THE INVENTION

Embodiments of the present invention include SRAMs in a semiconductor substrate having a buried insulator in a predetermined portion of the semiconductor substrate and a silicon-on-insulator (SOI) region including a semiconductor layer on the buried insulator. A flip-flop circuit is provided in the SOI region and a pass transistor connected to the flip-flop circuit is provided on a bulk region of the semiconductor substrate. The bulk region of the semiconductor substrate is a separate region from the SOI region.

In some embodiments of the present invention, the flip-flop circuit includes at least two CMOS inverters and the pass transistor is a plurality of pass transistors. The semiconductor substrate may be a P type semiconductor substrate and the buried insulator may be a thermal oxide layer with a thickness of about 500 angstroms (Å) to about 4000 Å. The semiconductor layer may have a maximum thickness of about 2000 Å.

In other embodiments of the present invention, an active region is defined in a portion of the semiconductor layer including one of the CMOS inverters and extends to the bulk region of the semiconductor substrate including one of the pass transistors such that an output terminal of the one of the CMOS inverters shares a same active region with source/drain terminals of the one of the pass transistors.

In further embodiments of the present invention, a first isolation layer is provided on the buried insulator in the semiconductor layer and separates devices in the SOI region. A second isolation layer is provided at a boundary between the SOI region and the bulk region. The second isolation layer is configured to allow the active region to extend to the bulk region and extends deeper than the buried insulator. The first isolation layer may be a chemical vapor deposition oxide layer and/or a chemical vapor deposition nitride layer. The second isolation layer may have a maximum thickness of approximately 3000 Å and may be a shallow trench isolation layer. The SRAM may further include a well contact node electrically connected to the semiconductor substrate in the bulk region below one of the pass transistors that controls a potential of a channel region of the one of the pass transistors to reduce a floating body effect in the SOI region.

In other embodiments of the present invention, an SRAM includes a semiconductor substrate having a buried insulator in a predetermined portion of the semiconductor substrate and a silicon-on-insulator (SOI) region including a semiconductor layer on the buried insulator. A flip-flop circuit is provided in the SOI region and a plurality of pass transistors are connected to the flip-flop circuit and provided on a bulk region of the semiconductor substrate, the bulk region of the semiconductor substrate being a separate region from the SOI region. A first isolation layer defines an active region. The active region includes a main part crossing the SOI region, a first branch protruding from the main part and a second branch protruding from the main part in a direction opposite to the first branch and from a different position of the main part from where the first branch protrudes. A second isolation layer forms a boundary between the SOI region and the bulk region, the second isolation layer being configured to allow the active region to extend to the bulk region. The flip-flop circuit includes a first CMOS inverter including an NMOS transistor and a PMOS transistor and a second CMOS inverter configured as a mirror image of the first CMOS inverter and including an NMOS transistor and a PMOS transistor, the second CMOS inverter being in the main part and the second branch of the active region. The pass transistors each include $N^+$-type source/drain regions on the active region and connected to the flip-flop circuit and a gate that crosses the active region between the $N^+$-type source/drain regions. At least one of the NMOS transistors includes $N^+$-type source/drain regions in the main part of the active region and a gate crossing the active region between the $N^+$-type source/drain regions of the at least one of the NMOS transistors and extending across the active region between $P^+$-type source/ drain regions in the first or second branch of the active region adjacent to the N⁺-type source/drain regions of the at least one of the NMOS transistors. The PMOS transistor of at least one of the CMOS inverters includes the P⁺-type source/drain regions in the first or second branch of the active region adjacent to the first N⁺-type source/drain regions of the at least one of the NMOS transistors and the first gate of the at least one of the NMOS transistors.

In further embodiments of the present invention, the second isolation layer is deeper than the first isolation layer and the buried insulator. The second isolation layer may be configured to allow both ends of the active region to extend to the bulk region in opposite directions from each other. One of the N⁺-type source/drain regions of the NMOS transistors may directly contact one of the P⁺-type source/drain regions. A different one of the N⁺-type source/drain regions of the NMOS transistors and a different one of the P⁺-type source/drain regions may be separated by the first isolation layer. One of the N⁺-type source/drain regions of the NMOS transistors may directly contact one of the N⁺-type source/drain regions of the pass transistors. A well contact node may be electrically connected to the semiconductor substrate of the bulk region below at least one of the pass transistors that controls a potential of a channel region of the at least one of the pass transistors to reduce a floating body effect in the SOI region.

In other embodiments of the present invention, an SRAM includes a semiconductor substrate having a buried insulator in a predetermined portion of the semiconductor substrate and an SOI region including a semiconductor layer on the buried insulator. A flip-flop circuit including two CMOS inverters is provided in an SOI region and two pass transistors are connected to the flip-flop circuit and provided on a bulk region of the semiconductor substrate. A first isolation layer defines a first active region and a second active region. The first active region includes a main part crossing the SOI region, a first branch that protrudes from the main part, and a second branch that protrudes from the main part in the same direction as the first branch and from a different region of the main part from where the first branch protrudes. The second active region is a mirror image of the first active region. A second isolation layer that allows the first and second active regions to extend to the bulk region is provided at the boundary between the SOI region and the bulk region.

The flip-flop circuit includes a first CMOS inverter including an NMOS transistor and a PMOS transistor in the first active region, and a second CMOS inverter configured as a mirror image of the first CMOS inverter and including an NMOS transistor and a PMOS transistor in the second active region. The two pass transistors each include first N⁺-type source/drain regions formed on an active region extending from either the first or second active region and connected to the flip-flop circuit and a gate that crosses the first or second active region between the N⁺-type source/drain regions-of the respective pass transistors. The SOI region is a portion of the semiconductor substrate on which the semiconductor layer is formed, and the bulk region is a portion of the semiconductor substrate excluding the SOI region. One of the NMOS transistors includes N⁺-type source/drain regions in the first branch of the first active region and a gate crossing the first branch between the first N⁺-type source/drain regions and extending across the second branch between P⁺-type source/drain regions and one of the PMOS transistors includes the P⁺-type source/drain regions formed in the second branch of the first active region and the gate of on of the pass transistors.

In some embodiments, the second isolation layer is deeper than the first isolation layer and the buried insulator and the second isolation layer is configured to allow both of the active regions to extend to the bulk region in opposite directions. One of the N⁺-type source/drain regions may directly contact one of the second P⁺-type source/drain regions. Another one of the N⁺-type source/drain regions and another one of the P⁺-type source/drain regions may be separated by the first isolation layer, and the first active region and the second active region may be separated by the first isolation layer. One of the N⁺-type source/drain regions of at least one of the NMOS transistors may directly contact one of the N⁺-type source/drain regions of at least one of the pass transistors. A well contact node may be electrically connected to the semiconductor substrate of the bulk region below one of the pass transistors that controls a potential of a channel region of the one of the pass transistors to reduce a floating body effect in the SOI region.

In further embodiments of the present invention, an SRAM includes an integrated circuit substrate having a buried insulator in a portion of the integrated circuit substrate and a silicon-on-insulator (SOI) region including a semiconductor layer on the buried insulator and a bulk region of the integrated circuit substrate separate from the SOI region. A flip-flop circuit is provided in the SOI region. The flip-flop circuit includes a first and second CMOS inverter. A first pass transistor in the bulk region is electrically coupled to the first CMOS inverter and a second pass transistor in the bulk region is electrically coupled to the second CMOS inverter.

In other embodiments of the present invention, the SOI region includes an active region having a main part and a first and second branch part extending at different points therefrom. The first CMOS inverter may include a first and a second N⁺-type source/drain region in the main part and a third N⁺-type source/drain region in the first branch part and a gate crossing the main part between the first and second N⁺-type source/drain regions and crossing the first branch between the first and third N⁺-type source/drain regions. The first N⁺-type source/drain region may also be a source/drain region of the first pass transistor. The second CMOS inverter may include a fourth and a fifth N⁺-type source/drain region in the main part and a sixth N⁺-type source/drain region in the second branch part and a gate crossing the main part between the fourth and fifth N⁺-type source/drain regions and crossing the second branch between the fourth and sixth N⁺-type source/drain regions. The fourth N⁺-type source/drain region may also be a source/drain region of the second pass transistor. In further embodiments of the present invention, the active region includes a first and second active region with an isolation layer therebetween. The first CMOS inverter is in the first active region and the second CMOS inverter is in the second active region in such embodiments. The first and second part may extend from the main part in a same direction or in opposite directions.

BRIEF DESCRIPTION OF THE DRAWINGS

The present invention will now be described with reference to exemplary embodiments thereof illustrated in the attached drawings in which.

DETAILED DESCRIPTION OF THE INVENTION

Figure 1:
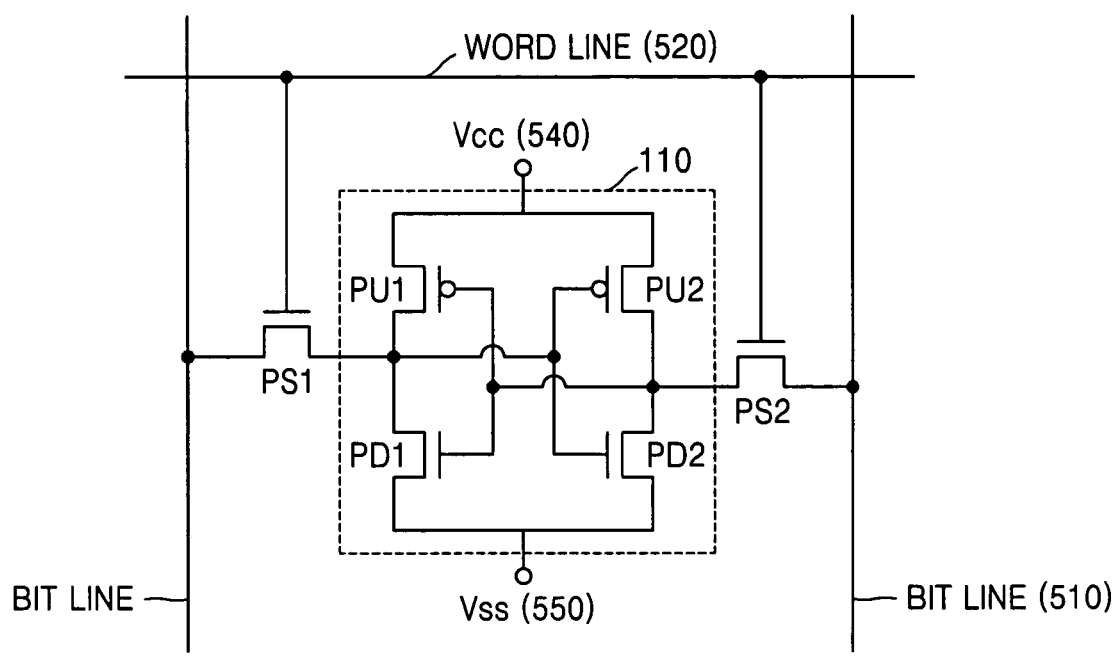
FIG. 1 is a circuit diagram of a static random access memory (SRAM) according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some embodiments of the present invention, a storage node in a static random access memory (SRAM) cell includes a full CMOS transistor. The CMOS transistors may be formed in a silicon-on-insulator (SOI) region and pass transistors for reading and writing data may be formed in a bulk region. In other words, for some embodiments of the present invention, a flip-flop circuit used as a storage node includes two inverters formed as CMOS transistors in the SOI region while the pass transistors, which are NMOS transistors, are formed in the bulk region. To form the SRAM cell, a partial SOI substrate may be prepared. The partial SOI substrate may include an SOI region and a region without an SOI structure, that is, a bulk region.

The SOI region may include an integrated circuit (semiconductor) substrate, a buried insulator and a semiconductor layer. For other embodiments of the present invention, the bulk region may include a conventional semiconductor substrate. The buried-insulator may cover bottom parts of the CMOS transistors formed in the SOI region. In other words, the CMOS transistors, i.e., the PMOS and NMOS transistors, may be floated on the buried insulator (or bottom insulator).

The PMOS and NMOS transistors may be formed on the same active region. The pass transistors in such embodiments may be formed on an extended portion of the active region that extends into the bulk region. Therefore, the active region may extend from the SOI region to the bulk region. An output terminal of a CMOS inverter may be common on the same active region as that of source/drain regions of the pass transistors.

Although the pass transistors may be formed only in the bulk region, the active region of the bulk region and that of the SOI region may be connected with each other. Thus, a floating body effect generally accompanying the use of the SOI structure may be reduced and/or effectively eliminated. In other words, the potential of the semiconductor substrate or a well under the pass transistors formed in the bulk region may be maintained stable by a certain well bias, thereby reducing or effectively eliminating the floating body effect. To control the well bias under the pass transistors, a well contact node may be formed. The well contact node may be electrically connected to the well under the pass transistors. In particular embodiments of the present invention, a path may be provided in the semiconductor substrate or the well to allow electric charges accumulated under the pass transistors as a result of the floating body effect to be driven out.

Some embodiments of the present invention utilize a novel layout of an SRAM cell that includes the SOI region and the bulk region, which may effectively reduce the size of the SRAM cell. In particular embodiments of the present invention, a novel layout of the active region is utilized that may further reduce the size of the SRAM cell.

Figure 2:
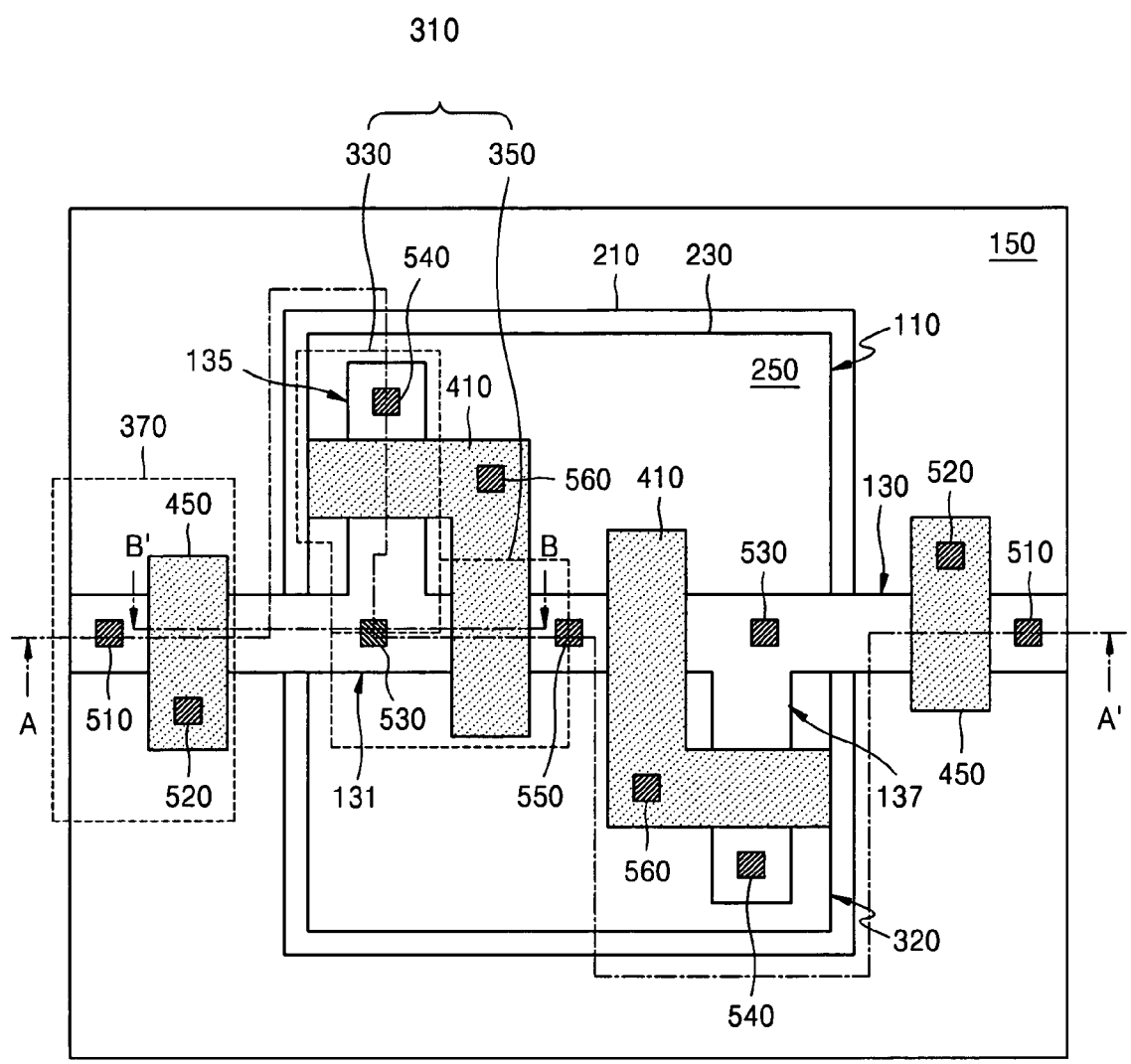
FIG. 2 is a plan view illustrating the layout of the SRAM of FIG. 1 according to some embodiments of the present invention.
Figure 3:
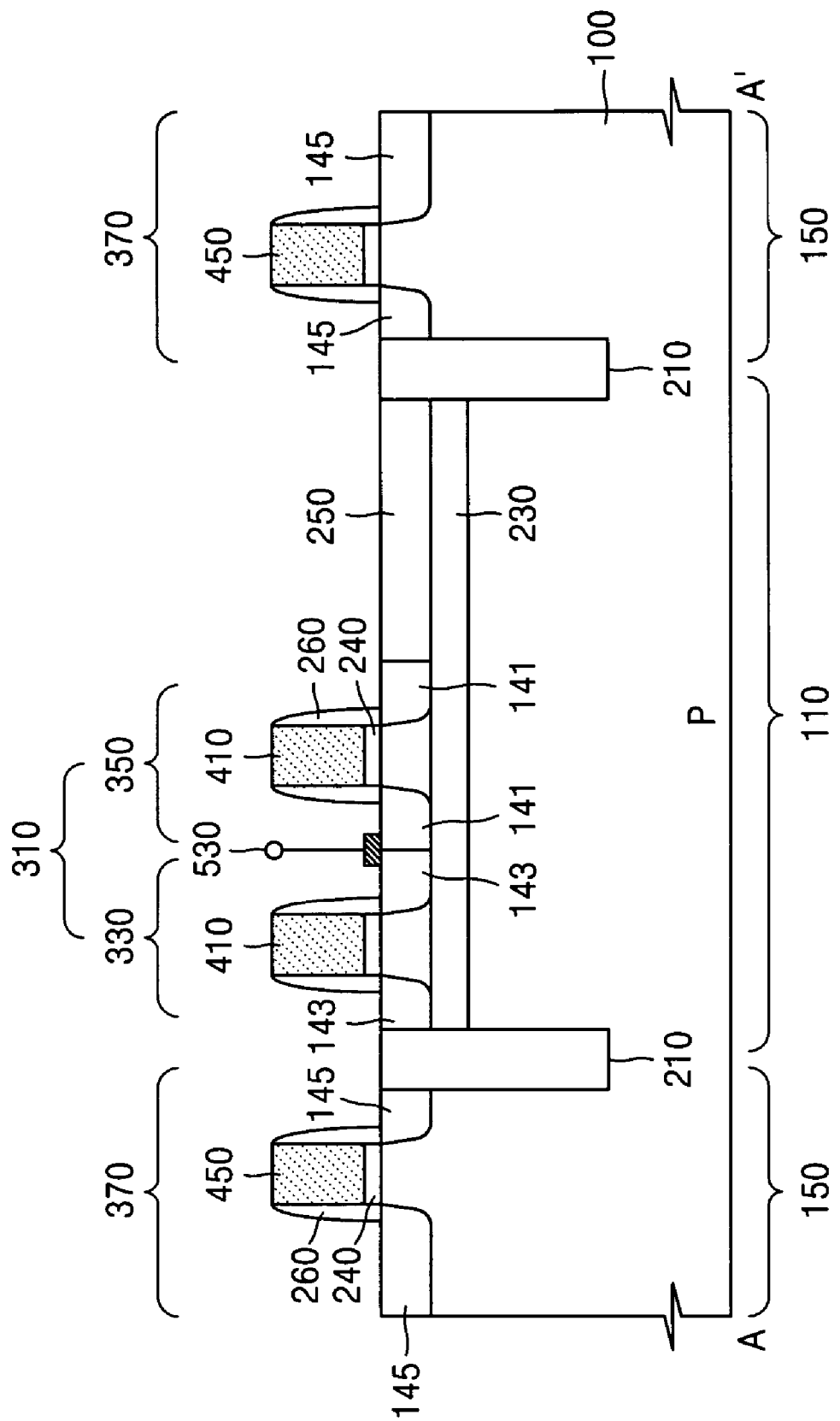
FIG. 3 is a cross-sectional view taken along the line A-A' of FIG. 2 illustrating an SRAM according to some embodiments of the present invention.
Figure 4:
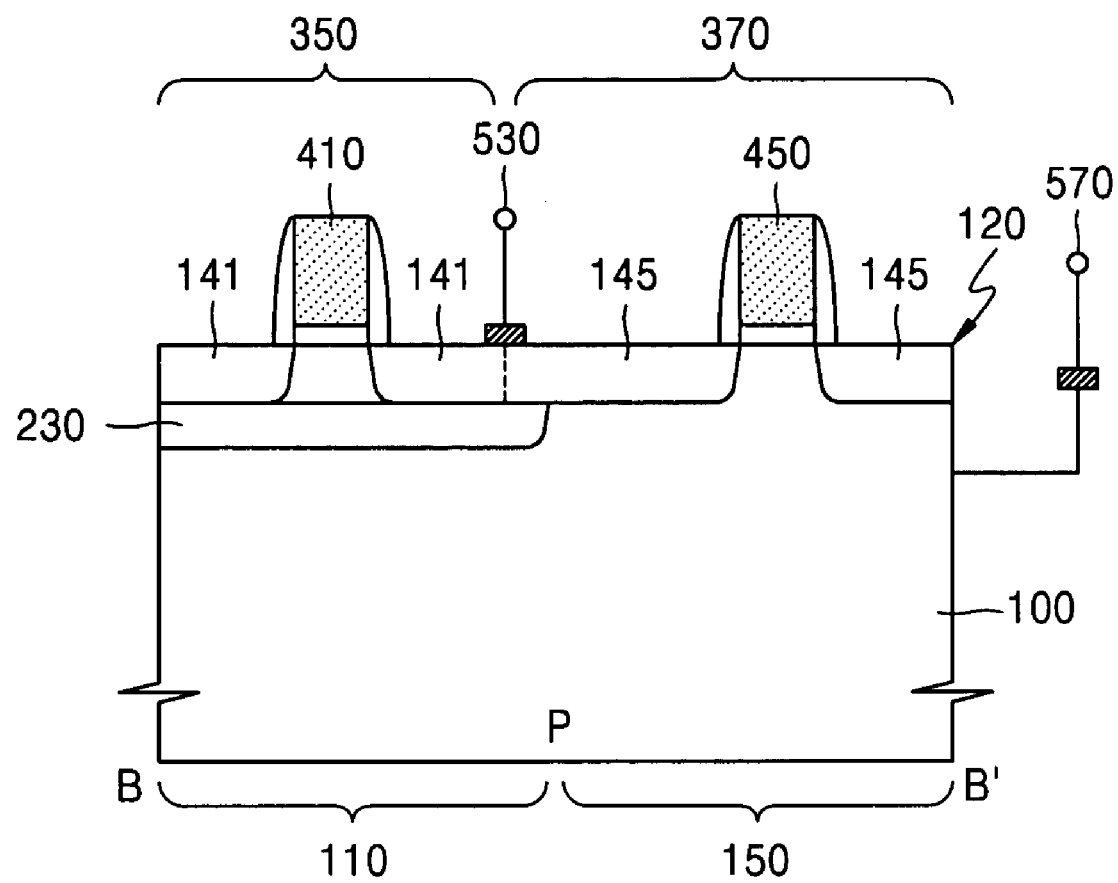
FIG. 4 is a cross-sectional view taken along the line B-B' of FIG. 2 illustrating an SRAM according to some embodiments of the present invention.

Embodiments of the present invention will now be further described with reference to FIGS. 1-4. FIG. 1 is a circuit diagram illustrating an SRAM according to some embodiments of the present invention. FIG. 2 is a plan view of a layout of the SRAM of FIG. 1 according to some embodiments of the present invention. FIG. 3 is a cross-sectional view taken along the line A-A' of FIG. 2 illustrating an SRAM according to some embodiments of the present invention. FIG. 4 is a cross-sectional view taken along the line B-B' of FIG. 2 illustrating an SRAM according to some embodiments of the present invention.

Referring first to FIG. 1, the illustrated embodiments of an SRAM include a storage node (within a schematically illustrated region 110), which is a flip-flop circuit including two CMOS inverters. The SRAM also includes pass transistors PS1 and PS2 for reading and writing data. The two CMOS inverters include two pull down transistors PD1 and PD2 and two pull up transistors PU1 and PU2. The CMOS inverters are formed in the SOI region 110. The pass transistors PS1 and PS2 are connected to a word line and to a bit line formed on a bulk region of a semiconductor substrate (i.e., outside the SOI region 110).

Embodiments of an SRAM as illustrated in FIG. 1 will now be further described with reference to the layout shown in FIG. 2 and the cross-sectional views illustrated in FIGS. 3 and 4. For the embodiments of FIGS. 2, 3, and 4, a partial SOI substrate including the SOI region 110 and a bulk region 150 is prepared in which an SRAM cell will be formed. The SOI region 110 includes a buried insulator 230 in a predetermined portion of a semiconductor substrate 100 and a semiconductor layer 120 formed on the buried insulator 230. The bulk region 150 is shown as formed of a remaining portion of the semiconductor substrate 100 other than the partially configured SOI region 110.

Here, the semiconductor layer 120 may be a monocrystalline silicon layer and may be disposed on the buried insulator 230. Thus, the semiconductor layer 120 may float on the buried insulator 230, which serves as a buried floating layer. The semiconductor layer 120 may be formed, for example, to a thickness no greater than about 2000 angstroms (Å). The buried insulator 230 may be formed in various ways to manufacture the SOI substrate, and, in some embodiments, is approximately 500 Å to 4000 Å thick. The buried insulator 230 may include a thermal oxide layer or an oxide or nitride layer formed by chemical vapor deposition (CVD).

Referring now to FIG. 2, to form an SRAM cell having six transistors, an active region 130 is defined in the substrate 100. The illustrated active region 130 includes a main part 131, which crosses the SOI region 110, a first branch 135 which protrudes from the main part 131, and a second branch 137 which protrudes, in an opposite direction to that of the first branch 135, from a different region of the main part 131 from where the first branch 135 protrudes. The active region 130 may also extend beyond the SOI region 110 to the bulk region 150. In other words, the active region 130 may not only include the SOI region 110 but may also extend to the bulk region 150.

The active region 130 in the SOI region 110 is defined by a first isolation layer 250 formed on the buried insulator 230 and the semiconductor Substrate 100. A second isolation layer 210 may be formed at the boundary between the SOI region 110 and the bulk region 150 and defines the SOI region 110. The second isolation layer 210 may surround the SOI region 110 and allow the active region 130 to extend to the bulk region 150.

The first isolation layer 250 may be formed by a local oxidation of silicon (LOCOS) separation process and/or a shallow trench isolation (STI) process. The first isolation layer 250 may be a chemical vapor deposition (CVD) oxide or nitride layer. The second isolation layer 210 may also be formed by one of the LOCOS and/or STI processes. The second isolation layer 210 may be formed by the STI process in a trench with a maximum depth of approximately 3000 Å.

The first isolation layer 250 and the second isolation layer 210 may be formed in the same process because the buried insulator 230 is disposed beneath the first isolation layer 250. The second isolation layer 210 may be a CVD oxide layer and/or a CVD nitride layer. The first isolation layer 250 may also be a CVD oxide layer and/or a CVD nitride layer. The second isolation layer 210 may be deeper than the buried insulator 230 so that the second isolation layer 210 facilitates forming of an isolation layer in a peripheral circuit region that operates the SRAM cell.

An isolation layer in the peripheral circuit region may be formed deeply because a deep isolation layer is generally beneficial to a PMOS transistor formed in the peripheral region of the semiconductor substrate 100. When forming the SRAM, an isolation layer in the peripheral circuit region and the second isolation layer 210 may be formed simultaneously.

The second isolation layer 210 may also enhance operating characteristics of the pass transistors PS1 and PS2 because the second isolation layer 210 isolates the pass transistors PS1 and PS2 from the pull up and pull down transistors PU1 and PD1 and/or PU2 and PD2 of the CMOS inverter. In some embodiments of the present invention using a CMOS process, CMOS transistors 330 and 350, collectively 310, are formed in the SOI region 110 and a pass transistor 370, which is an NMOS transistor, is formed in the bulk region 150 on the active region 130 defined by the first isolation layer 250.

Referring now to the embodiments of FIG. 3, the semiconductor substrate 100 may be formed of a P-type semiconductor and N-type impurities ion-implanted into the main part 131 of the active region 130 of the semiconductor layer 120, thereby forming first $N^+$-type source/drain regions 141. Additional $N^+$-type source/drain regions 145 of the pass transistors 370 may also be formed by the ion-implantation of N-type impurities into the semiconductor substrate 100. As a P type substrate may be used as the semiconductor substrate 100, there may be no need to form a P well. However, a P well may be additionally formed under the pass transistors 370 if desired.

$P^+$-type source/drain regions 143 may be formed by the ion-implantation of P-type impurities into the first branch 135 of the active region 130 adjacent to the first source/drain regions 141. Here, an additional well forming process may not be required as all of the first source/drain regions 141 and the second source/drain regions 143 are formed in the semiconductor layer 120 on the buried insulator 230 in the SOI region 110. In particular, an additional N well for the PMOS transistor 330 may be unnecessary.

It may be desired to ion-implant P type impurities into a portion of the semiconductor layer 120 occupied by the PMOS transistor 330 to secure a stable channel between the second $N^+$-type source/drain regions 143. However, it is not necessary to form a well like a conventional N well that extends over a large portion of the semiconductor substrate 100.

It may be possible to secure a channel for the PMOS transistor 330 by ion-implanting of $N^+$-type impurities for the first source/drain regions 141 to the PMOS transistor region 330 at the same time. Additionally, increased security of the channel may be provided using an ion-implanting process for adjusting a threshold voltage VT. Therefore, it may not be necessary to form a well, such as an N well, that extends over a large portion of the semiconductor substrate 100 and is formed when configuring CMOS transistors, as in a conventional bulk semiconductor substrate.

As a result, the size of the SRAM cell may be significantly smaller than a conventional SRAM in some embodiments of the present invention because the area taken up by an N well may be smaller. For example, a reduction of approximately fifteen percent may be achieved in particular embodiments of the present invention.

The source/drain regions may be formed in the second branch 137 and a portion of the main part 131 adjacent to the second branch 137 as well as in the first branch 135 and a portion of the main part 131 adjacent to the first branch 135 of the active region 130 such that the active region and the source/drain regions have a mirrored structure.

As shown in the embodiments of FIG. 3, gates 410 and 450, including a gate dielectric layer 240 and a spacer 260, are formed on the source/drain regions 141, 143, and 145. The CMOS transistors 310 and the pass transistor 370 include the gates 410 and 450, the gate dielectric layer 240, the spacer 260 and the source/drain regions 141, 143, and 145. To be more specific, referring to the embodiments of FIGS. 2 and 3, the first gate 410 crosses the active region 130 of the main part 131 between the first source/drain regions 141 and extends to cross the active region 130 of the first branch 135 between the second source/drain regions 143. That is, the first gate 410 in the illustrated embodiments is not straight. Similarly, another gate, being a mirror image of the first gate 410, is formed on the second branch 137. Meanwhile, the second gate 450 is formed on the active region 130 between the third source/drain regions 145.

The NMOS transistor 350 includes the first source/drain regions 141 and the first gate 410, and the PMOS transistor 330 includes the second source/drain regions 143 and the first gate 410. The CMOS transistor 310 includes the NMOS transistor 350 and the PMOS transistor 330. A first CMOS inverter includes the CMOS transistor. A second CMOS inverter includes an NMOS transistor and a PMOS transistor formed on the main part 131 and the second branch 137 of the active region 130. Referring to FIG. 2, a flip-flop circuit includes the first CMOS inverter and the second CMOS inverter.

In the bulk region 150 of the illustrated embodiments of FIGS. 2 and 3, the pass transistor 370 includes the third source/drain regions 145 and the second gate 450 and is connected to each of the first and second CMOS inverters. Referring to the embodiments of FIGS. 2 and 3, any one of the first source/drain regions 141 of the NMOS transistor 350 may directly contact any one of the second source/drain regions 143 of the PMOS transistor 330. Further, any one of the first and the second source/drain regions 141 and 143 may directly contact any one of the third source/drain regions 145.

One of an output terminal 530 and a storage node of the CMOS inverter 310 may be formed between the first source/drain regions 141 and the second source/drain regions 143 such that the one of the output terminal 530 and the storage node of the CMOS inverter 310 is electrically connected to both the first source/drain regions 141 and the second source/drain regions 143. As the active region 130 extends into the bulk region 150, a source/drain terminal 510 of the pass transistor 370, that is, a bit line terminal, may be formed on the active region 131 and may be in electrical contact with the output terminal 530. This configuration is in accordance with the circuit diagram of FIG. 1.

Referring again to the embodiments of FIG. 2, the NMOS transistor 350 and the PMOS transistor 330 are separated by the second isolation layer 250. In other words, the second isolation layer 250 separates the first source/drain regions 141 from the second source/drain regions 143. Referring to the circuit diagram of the FIG. 1 and the cross-section of FIG. 2, the SRAM includes a Vcc terminal 540 and a Vss terminal 550, and a word line terminal including a first gate terminal 560 and a second gate terminal 520. The Vss terminal 550 can be connected to the circuit with a single contact. When the positions of the transistors are changed, for example, when the PMOS transistor 330 and the NMOS transistor 350 are switched, the Vss terminal 550 becomes the Vcc terminal 540 and is connected to the circuit with a single contact. Hence, it may be easier to form the interconnected wiring required to form the circuit of FIG. 1.

A variety of advantages may be obtained when the CMOS inverters including the PMOS and NMOS transistors 330 and 350 are formed on the SOI region 110 for some embodiments of the present invention. First, it may be unnecessary to have a well region that separates the NMOS transistor 350 from the PMOS transistor 330 because the two inverters for storing data are configured in a flip-flop circuit in the SOI region 110. Thus, compared to an SRAM with inverters formed in the bulk region 150, a fifteen percent reduction in the size of the SRAM cell may be achieved. In addition, excellent SER and a reduction or even prevention of latch-up may be provided in some embodiments as the CMOS transistor 310, including the NMOS transistor 350 and the PMOS transistor 330, is formed in the SOI region 110. In particular, as the NMOS transistor 350, which has relatively high carrier mobility, is formed in the SOI region 110, the operating speed of the SRAM may be significantly increased.

Moreover, since the pass transistor 370 is formed in the bulk region 150, a stable well potential may be achieved by applying a well bias in some embodiments of the present invention. Thus, a floating body effect, which may be a problem in conventional SOI devices, may be reduce or even effectively be prevented. In other words, a well contact node may be formed by using a well or the semiconductor substrate 100 under a channel of the pass transistor 370 as a path. Then, the potential of the channel region may be controlled externally by applying a voltage to the well contact node.

Referring now to the embodiments of FIG. 4, the NMOS transistor 350 in the SOI region 110 and the pass transistor 370 in the bulk region 150 are both formed in the active region 130. The P type semiconductor substrate 100, or a well, exists below the pass transistor 370. The potential of the well or a channel may be stable when the well contact node 570 is electrically connected to the well or the semiconductor substrate 100. In other words, the potential of the well or the channel may be stabilized by applying a well bias. Specifically, electric charges accumulated and floating on the buried insulator 230 as a result of the floating body effect may be driven out of the SRAM via the well contact node. Therefore, despite the general characteristics of an SOI device, it may be possible to reduce or effectively eliminate the floating body effect.

In addition, since the partial SOI substrate including the bulk region 150 is used, an additional circuit, for example, an anti-static circuit, may be formed in the bulk region 150 in order to improve the reliability of the SRAM cell. It is generally difficult to form such an anti-static circuit in the SOI region 110 whereas an anti-static circuit can generally easily be formed in the bulk region 150. Therefore, the reliability of the SRAM may be improved when the partial SOI substrate having the bulk region 150 is used.

Referring to FIG. 2, the SRAM may include the active region 130 but may also include a divided active region, which may allow further reduction of the size of the SRAM cell.

Figure 5:
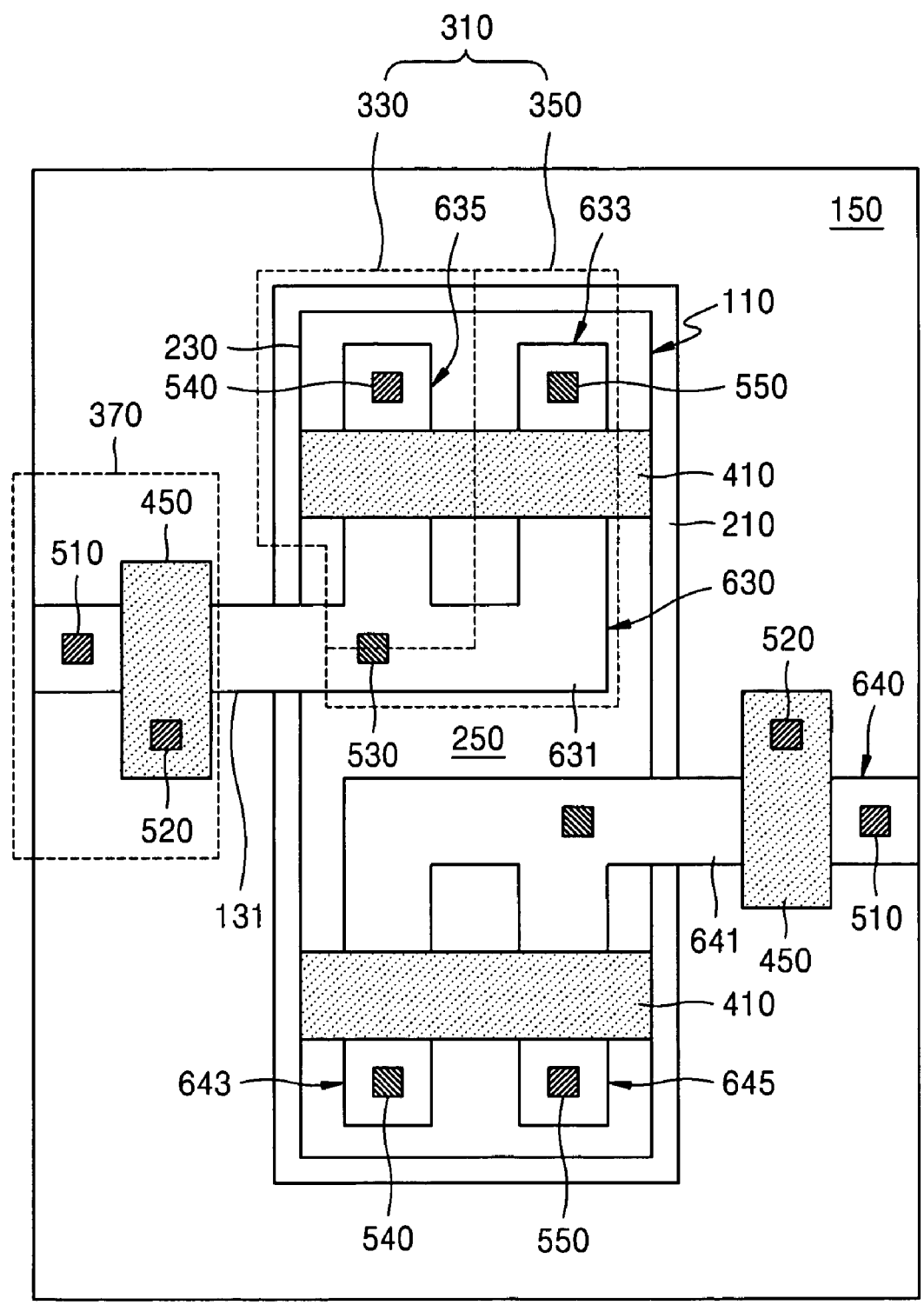
FIG. 5 is a plan view illustrating the layout of an SRAM according to further embodiments of the present invention.

Further embodiments of the present invention will now be described with reference to FIG. 5. FIG. 5 is a plan view of the layout of an SRAM cell according to some other embodiments of the present invention. As shown in the embodiments of FIG. 5, an SRAM includes two active regions 630 and 640 that mirror one another. The division of the active region may enable a further reduction in the size of the SRAM cell from that of an SRAM cell having the layout of FIG. 2. A detailed description of elements of the embodiments of the present invention in FIG. 5 that are identical to elements of the embodiments described with reference to FIG. 2 will not be further provided as they have been fully described above. As described with reference to the embodiments of FIG. 2 through FIG. 4, an SRAM according to the embodiments of FIG. 5 may include a SOI substrate having an SOI region 110 and a bulk region 150. The SRAM further includes a first isolation layer 250, a second isolation layer 210, and a buried insulator 230.

The SRAM shown in the embodiments of FIG. 5 includes a first active region 630 and a second active region 640. The first active region 630 includes a first main part 631, which crosses the SOI region 110 on a semiconductor layer 120, a first branch 633, which protrudes from the first main part 631, and a second branch 635, which protrudes from the first main part 631 in the same direction as the first branch 633 from a different region of the first main part 631 from where the first branch 633 protrudes. The second active region 640 is a mirror image of the first active region 630. The first branch 633 and the second branch 635 protrude in the same direction and are separated by the second isolation layer 250.

The second active region 640 includes a second main part 641 separated from the first main part 631 by the second isolation layer 250 that parallels the first main part 631, a third branch 643, which protrudes from the second main part 641 in a direction opposite to the direction in which the first branch 633 protrudes from the first main part 631, and a fourth branch 645, which protrudes from the second main part 641 in the same direction as the third branch 643 but from a different position on the second main part 641 from where the third branch 643 protrudes.

As described with reference to FIG. 3, first $N^+$-type source/drain regions are formed in the first branch 633 of the first active region 630 and the second $P^+$-type source/drain regions are formed in the second branch 635 of the first active region 630. Moreover, a first gate 410, which crosses the first branch 633 between the first source/drain regions, extends across the second branch 635 between the second source/drain regions.

An NMOS transistor 350 includes the first source/drain regions and the first gate 410, and a PMOS transistor 330 includes the second source/drain regions and the first gate 410. As described with reference to FIG. 4, a first CMOS inverter 310 includes the NMOS transistor 350 and the PMOS transistor 330. Similarly, in the second active region 640, there is a second CMOS inverter laid out as a mirror image of the first CMOS inverter 310. The second CMOS inverter includes an NMOS transistor and a PMOS transistor and forms a flip-flop circuit together with the first CMOS inverter 310.

As described with reference to FIG. 3, the first isolation layer 250 is formed at the boundary between the SOI region 110 and the bulk region 150. The first isolation layer 250 allows each of the first and the second active regions 630 and 640 to extend to the bulk region 150.

Third N+-type source/drain regions are formed in the active regions 630 and 640 and are connected to the flip-flop circuit. Further, a second gate 450 crosses the active regions 630 and 640 between the third source/drain regions. The third $N^+$-type source/drain regions and the second gate 450 constitute two pass transistors 370. As the active regions 630 and 640 extend to the bulk region 150 in opposite directions, the pass transistors 370 are also formed in opposite directions.

Various of the above described embodiments of the present invention may provide an SRAM cell having improved characteristics. In particular, the SRAM cell according to the embodiments illustrated in FIG. 5 may be even smaller than an SRAM cell according the embodiments of the present invention illustrated in FIG. 2.

As described above, embodiments of the present invention provide an SRAM including six transistors that may have improved characteristics. These characteristics may include integration density, performance (for example, static noise margin (SNM)) and/or reliability (for example, SER).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A static random access memory (SRAM), comprising:
   a semiconductor substrate;
   a buried insulator in a predetermined portion of the semiconductor substrate;
   a silicon-on-insulator (SOI) region including a semiconductor layer on the buried insulator;
   a flip-flop circuit in the SOI region, the flip-flop circuit comprising at least two CMOS inverters; and
   a plurality of pass transistors connected to the flip-flop circuit and on a bulk region of the semiconductor substrate, the bulk region of the semiconductor substrate being a separate region from the SOI region;
   wherein an active region is defined in a portion of the semiconductor layer including one of the CMOS inverters and extends to the bulk region of the semiconductor substrate including one of the pass transistors such that an output terminal of the one of the CMOS inverters shares a same active region with source/drain terminals of the one of the pass transistors, wherein the active region includes a main part crossing the SOI region, a first branch protruding from the main part and a second branch protruding from the main part in a direction opposite to the first branch and from a different position of the main part from where the first branch protrudes.

2. The SRAM of claim 1, wherein the semiconductor substrate is a P type semiconductor substrate.

3. The SRAM of claim 1, wherein the buried insulator comprises a thermal oxide layer with a thickness of about 500 angstroms (Å) to about 4000 Å.

4. The SRAM of claim 1, wherein the semiconductor layer has a maximum thickness of about 2000 angstroms (Å).

5. The SRAM of claim 1, further comprising: a first isolation layer formed on the buried insulator in the semiconductor layer and separates devices in the SOI region; and a second isolation layer formed at a boundary between the SOI region and the bulk region the second isolation layer being configured to allow the active region to extend to the bulk region and being formed deeper than the buried insulator.

6. The SRAM of claim 5, wherein the first isolation layer comprises a chemical vapor deposition oxide layer and/or a chemical vapor deposition nitride layer.

7. The SRAM of claim 5, wherein the second isolation layer has a maximum thickness of approximately 3000 angstroms (Å).

8. The SRAM of claim 5, wherein the second isolation layer comprises a shallow trench.

9. The SRAM of claim 1, further comprising a well contract node electrically connected to the semiconductor substrate in the bulk region below one of the pass transistors that controls a potential of a channel region of the one of the pass transistors to reduce a floating body effect in the SOI region.

10. The SRAM of claim 1 wherein the bulk region comprises a region of the semiconductor substrate and wherein buried insulator extends between the semiconductor substrate and the semiconductor layer on the buried insulator without extending to the bulk region.

11. A static random access memory (SRAM) comprising:
a semiconductor substrate;
a buried insulator in a predetermined portion of the semiconductor substrate;
a silicon-on-insulator (SOI) region including a semiconductor layer on the buried insulator;
a flip-flop circuit in the SOI region; and
a plurality of pass transistors connected to the flip-flop circuit and on a bulk region of the semiconductor substrate, the bulk region of the semiconductor substrate being a separate region from the SOI region;
a first isolation layer defining an active region, the active region including a main part crossing the SOI region, a first branch protruding from the main part and a second branch protruding from the main part in a direction opposite to the first branch and from a different position of the main part from where the first branch protrudes;
a second isolation layer forming a boundary between the SOI region and the bulk region, the second isolation layer being configured to allow the active region to extend to the bulk region;
wherein the flip-flop circuit includes a first CMOS inverter including an NMOS transistor and a PMOS transistor and a second CMOS inverter in the main part and the second branch of the active region and configured as a mirror image of the first CMOS inverter and including an NMOS transistor and a PMOS transistor;
wherein the pass transistors each include $N^+$-type source/drain regions on the active region and connected to the flip-flop circuit and a gate that crosses the active region between the $N^+$-type source/drain regions; wherein at least one of the NMOS transistors comprises $N^+$-type source/drain regions in the main part of the active region and a gate crossing the active region between the $N^+$-type source/drain regions of the at least one of the NMOS transistors and extending across the active region between $P^+$-type source/drain regions in the first or second branch of the active region adjacent to the $N^+$-type source/drain regions of the at least one of the NMOS transistors; and
wherein the PMOS transistor of at least one of the CMOS inverters comprises the $P^+$-type source/drain regions in the first of second branch of the active region adjacent to the first $N^+$-type source/drain regions of the at least one of the NMOS transistors and the first gate of the at least one of the NMOS transistors.

12. The SRAM of claim 11, wherein the second isolation layer is deeper than the first isolation layer and the buried insulator.

13. The SRAM of claim 11, wherein the second isolation layer is configured to allow both ends of the active region to extend to the bulk region in opposite directions from each other.

14. The SRAM of claim 11, wherein one of the $N^+$-type source/drain regions of the NMOS transistors directly contacts one of the $N^+$-type source/drain regions of the pass transistors.

15. The SRAM of claim 11, further comprising a well contact node electrically connected to the semiconductor substrate of the bulk region below at least one of the pass transistors that controls a potential of a channel region of the at least one of the pass transistors to reduce a floating body effect in the SOI region.

16. The SRAM of claim 11, wherein buried insulator extends between the semiconductor substrate and the semiconductor layer on the buried insulator without extending to the bulk region.

17. The SRAM of claim 11 wherein one of the $N^+$-type source/drain regions of the NMOS transistors directly contacts one of the $P^+$type source/drain regions.

18. The SRAM of claim 17, wherein a different one of the $N^+$-type source/drain regions of the NMOS transistors and a different one of the $P^+$-type source/drain regions are separated by the first isolation layer.

19. A static random access memory (SRAM) comprising:
a semiconductor substrate;
a buried insulator in a predetermined portion of the semiconductor substrate;
an SOI region including a semiconductor layer on the buried insulator;
a flip-flop circuit including two CMOS inverters in the SOI region; and
two pass transistors on a bulk region of the semiconductor substrate and connected to the flip-flop circuit;
a first isolation layer defining a first active region and a second active region, wherein:
the first active region includes a main part crossing the SOI region, a first branch that protrudes from the main part, and a second branch that protrudes from the main part in the same direction as the first branch and from a different region of the main part from where the first branch protrudes;
the second active region is a mirror image of the first active region;
a second isolation layer at the boundary between the SOI region and the bulk region and that allows the first and second active regions to extend to the bulk region;
the flip-flop circuit includes a first CMOS inverter including an NMOS transistor and a PMOS transistor in the first active region, and a second CMOS inverter including an NMOS transistor and a PMOS transistor formed in the second active region and configured as a mirror image of the first CMOS inverter;
the two pass transistors each include first $N^+$-type source/drain regions on an active region extending from either the first or second active region and connected to the flip-flop circuit and a gate that crosses the first or second active region between the $N^+$-type source/drain regions of the respective pass transistors;
the SOI region is a portion of the semiconductor substrate on which the semiconductor layer is formed, and the bulk region is a portion of the semiconductor substrate excluding the SOI region;
one of the NMOS transistors comprises $N^+$-type source/drain regions in the first branch of the first active region and a gate crossing the first branch between the first $N^+$-type source/drain regions and extending across the second branch between $P^+$-type source/drain regions; and
one of the PMOS transistors comprises the $P^+$-type source/drain regions formed in the second branch of the first active region and the gate of on of the pass transistors.

20. The SRAM of claim 19, wherein the second isolation layer is deeper than the first isolation layer and the buried insulator.

21. The SRAM of claim 19, wherein the second isolation layer is configured to allow both of the active regions to extend to the bulk region in opposite directions.

22. The SRAM of claim 19, wherein one of the N$^+$-type source/drain regions of at least one of the NMOS transistors directly contacts one of the N$^+$-type source/drain regions of at least one of the pass transistors.

23. The SRAM of claim 19, further comprising a well contact node electrically connected to the semiconductor substrate of the bulk region below one of the pass transistors that controls a potential of a channel region of the one of the pass transistors to reduce a floating body effect in the SOI region.

24. The SRAM of claim 19, wherein one of the N$^+$-type source/drain regions directly contacts one of the second P$^+$-type source/drain regions.

25. The SRAM of claim 24 wherein another one of the N$^+$-type source/drain regions and another one of the P$^+$-type source/drain regions are separated by the first isolation layer, and the first active region and the second active region are separated by the first isolation layer.

26. A static random access memory (SRAM) comprising:
an integrated circuit substrate;
a buried insulator in a portion of the integrated circuit substrate;
a silicon-on-insulator (SOI) region including a semiconductor layer on the buried insulator;
a bulk region of the integrated circuit substrate separate from the SOI region;
a flip-flop circuit in the SOI region, the flip-flop circuit including a first and second CMOS inverter;
a first pass transistor in the bulk region and electrically coupled to the first CMOS inverter; and
a second pass transistor in the bulk region and electrically coupled to the second CMOS inverter;
wherein the SOI region includes an active region having a main part and a first and second branch part extending at different points therefrom, and wherein the first CMOS inverter comprises:
a first and a second N$^+$-type source/drain region in the main part and a first and second P$^+$-type source/drain region in the first branch part; and
a gate crossing the main part between the first and second N$^+$-type source/drain regions and crossing the first branch between the first and second P$^+$-type source/drain regions; and
wherein the first N$^+$-type source/drain region further comprises a source/drain region of the first pass transistor.

27. The SRAM of claim 26, wherein buried insulator extends between the semiconductor substrate and the semiconductor layer on the buried insulator without extending to the bulk region.

28. The SRAM of claim 26 wherein the second CMOS inverter comprises:
the second and a third N$^+$-type source/drain region in the main part and third and x fourth P$^+$-type source/drain region in the second branch part; and
a gate crossing the main part between the second and third N$^+$-type source/drain regions and crossing the second branch between the third and fourth P$^+$-type source/drain regions; and
wherein the third N$^+$-type source/drain region further comprises a source/drain region of the second pass transistor.

29. The SRAM of claim 28 wherein the first and second branch part extend from the main part in opposite directions.

30. The SRAM of claim 26 wherein the SOI region comprises a first and second active region with an isolation layer therebetween and wherein the first CMOS inverter is in the first active region and the second CMOS inverter is in the second active region.

31. The SRAM of claim 30 wherein the first active region includes a main part crossing the SOI region, a first branch that protrudes from the main part, and a second branch that protrudes from the main part in the same direction as the first branch and from a different region of the main part from where the first branch protrudes; and the second active region is a mirror image of the first active region.

32. A static random access memory (SRAM) comprising:
a semiconductor substrate;
a buried insulator in a predetermined portion of the semiconductor substrate;
a silicon-on-insulator (SOI) region including a semiconductor layer on the buried insulator;
a flip-flop circuit in the SOI region; and
a pass transistor connected to the flip-flop circuit and on a bulk region of the semiconductor substrate, the bulk region of the semiconductor substrate being a separate region from the SOI region;
wherein an active region is defined in a portion of the semiconductor layer including the flip-flop circuit, the active region including a main part crossing the SOI region, a first branch protruding from the main part and a second branch protruding from the main part in a direction opposite to the first branch and from a different position of the main part from where the first branch protrudes.

* * * * *

UNITED STATES PATENT AND TRADEMARK OFFICE
CERTIFICATE OF CORRECTION

PATENT NO.       : 7,476,944 B2                                     Page 1 of 1
APPLICATION NO.  : 10/893815
DATED            : January 13, 2009
INVENTOR(S)      : Lee It is certified that error appears in the above-identified patent and that said Letters Patent is hereby corrected as shown below:

Column 16, Claim 28, Line 8:
Please correct "and x fourth" to read -- and fourth --

Signed and Sealed this

Seventeenth Day of March, 2009

JOHN DOLL
*Acting Director of the United States Patent and Trademark Office*